April 22, 1969 A. M. PETERS ET AL 3,440,552
PUSH-PULL AMPLIFIER INCLUDING TRANSISTOR
Filed June 7, 1967
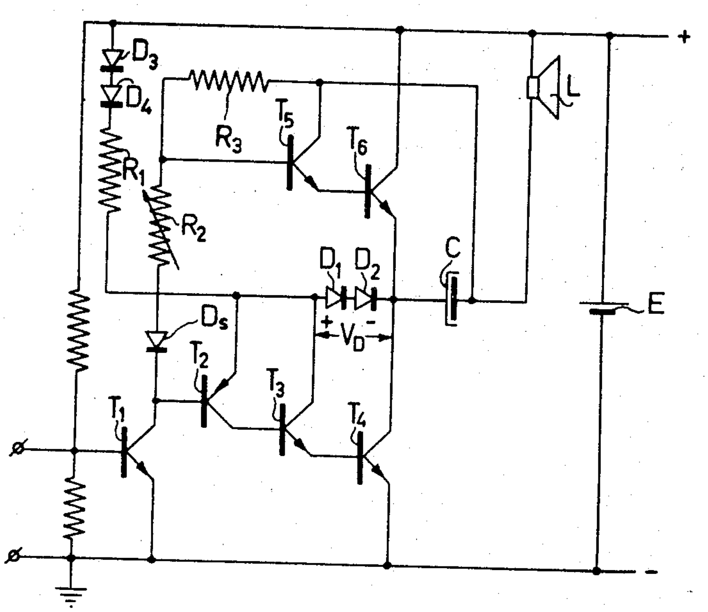
INVENTORS
ALPHONSUS M. PETERS
JACOBUS J. RONGEN
BY
AGENT United States Patent Office 3,440,552

Patented Apr. 22, 1969

3,440,552

PUSH-PULL AMPLIFIER INCLUDING TRANSISTOR

Alphonsus Maria Peters and Jacobus Johannes Rongen, Mollenhutseweg, Nijmegen, Netherlands, assignors, by mesne assignments, to U.S. Philips Corporation, New York, N.Y., a corporation of Delaware Filed June 7, 1967, Ser. No. 644,272

Claims priority, application Netherlands, June 10, 1966, 6608051

Int. Cl. H03f 3/26

U.S. Cl. 330—15 9 Claims

ABSTRACT OF THE DISCLOSURE

A push-pull transistor amplifier is described in which the supply current flows serially in the collector-emitter paths of the two output transistors. One of the drivers has its emitter connected to the base of the corresponding output transistor, and its collector connected to the junction of a resistor and diode means connected serially in that order between a supply source and the collector of the corresponding output transistor.

This invention relates to push-pull amplifying devices including two output transistors, in which the supply current flows in series through the emitter-collector paths of these transistors and in which a point of their common connecting circuit is connected to the load, the output transistors being preceded by driver transistors. An object of the invention is more particularly to provide a device suitable to be incorporated in integrated circuit techniques.

A known device of this kind comprises a push-pull stage and a driver stage. One branch of the push-pull stage includes the cascade connection of a pnp-transistor having a base-collector current gain factor $h_{fe}$ approximately equal to unity and two npn-transistors, the other branch thereof including the cascade connection of two npn-transistors.

The final transistors of the two branches are the output transistors and the remaining ones are the driver transistors. This device has the disadvantage, that, due to the existing emitter-base voltages of the transistors, the control range of at least one driver transistor is reduced and this is undesirable, especially if the transistors are operated on low supply voltages. The term "control range" is to be understood to mean the voltage trajectory at the output electrode in which the transistor amplifies substantially linearly.

An object of the invention is to provide a device in which this disadvantage is mitigated.

The invention is characterized in that at least one diode which is polarized in the pass direction, is included between the collector of one driver transistor, the emitter of which is connected to the base of the associated output transistor, and the said common connecting circuit, the pass direction of the said diode corresponding to an increase in the collector supply voltage of this driver transistor relative to that of the said output transistor.

In order that the invention may be readily carried into effect it will now be described in detail, by way of example, with reference to the accompanying diagrammatic drawing.

In the sole figure $T_1$ indicates a first control transistor of the npn-type, the collector of which is connected to two branches, one branch including a driver transistor $T_2$ of the pnp-type, followed by a driver transistor $T_3$ of the npn-type and an output transistor $T_4$ of the npn-type, and the other branch including an adjusting resistor $R_2$ and a driver transistor $T_5$ of the npn-type, followed by an output transistor $T_6$ of the npn-type. The output transistors $T_4$ and $T_6$ are fed in series by the supply current and are adjusted so that approximately half the supply voltage is set up at their common connecting circuit.

The base of the driver transistor $T_5$ is connected to the adjusting resistor $R_2$ and its emitter is connected to the base of the output transistor $T_6$. The collector of the output transistor $T_6$ is connected to the positive terminal of a direct voltage source E and a connecting terminal of a loudspeaker L is also connected to this point. The collector of transistor $T_5$ is connected to the other connecting terminal of the loudspeaker L. This method of circuiting prevents the base-emitter voltage of the transistor $T_6$ from reducing the control range of the transistor $T_5$. In fact, when the control of transistor $T_6$ is at a maximum, and hence the maximum current flows through this transistor, an alternating voltage is set up across the loudspeaker L having a polarity such that the instantaneous voltage of the collector of transistor $T_5$ is higher than the instantaneous voltage of the collector of transistor $T_6$.

The collector of transistor $T_2$ is connected to the base of transistor $T_3$. The emitter of transistor $T_3$ is connected to the base of output transistor $T_4$ and the emitter of output transistor $T_4$ is connected to the negative terminal of the direct voltage source E. The common point of the emitter of transistor $T_2$ and the collector of transistor $T_3$ is connected on the one hand via a resistor $R_1$, possibly in series with one or more diodes $D_3$, $D_4$ operating in the forward direction, to the positive terminal of the direct voltage source E and is connected on the other hand via one or more diodes $D_1$, $D_2$ to the common point of the collector of output transistor $T_4$ and the emitter of output transistor $T_6$. The last-mentioned common point is connected through a capacitor C to a connecting terminal of the loudspeaker L, the other connecting terminal of the loudspeaker being connected to the positive terminal of the direct voltage source E.

The polarity of the two diodes $D_1$ and $D_2$ is such that the common point of the emitter of transistor $T_2$ and the collector of transistor $T_3$ has a potential which is higher than that of the collector of output transistor $T_4$. Consequently the control range of transistor $T_3$, which had decreased due to the emitter-base threshold voltages of the transistor $T_3$ and $T_4$, is increased again in the desired manner. The no-load current flowing through the diodes $D_1$ and $D_2$ is adjusted with the aid of resistor $R_1$. This adjusting current is chosen so that a substantially constant voltage drop occurs across the two diodes, which is substantially independent of the alternating current which flows through the said diodes when the output trasnistor $T_4$ is controlled into its saturation range. If the said voltage drop $V_d$ across the diodes $D_1$ and $D_2$ is greater than the sum of the base-emitter voltages of the transistors $T_3$ and $T_4$, the control range of the transistors $T_2$ and $T_3$ is determined only by their own respective knee voltages.

The diodes $D_1$ and $D_2$ cause also a certain compensation to be brought about for the temperature-dependent inner base-emitter threshold voltage of the transistors $T_5$ and $T_6$. As is well-known, the voltage drop $V_o$ across a semiconductor diode or across the emitter-base path of a transistor decreases with an increase in temperature. The emitter of transistor $T_2$ has a potential $+V_D=2V_o$ relative to the common point of the transistors $T_4$ and $T_6$. Consequently the collector of transistor $T_1$ has a voltage $V_o$ since the voltage drop $V_o$ across the emitter-base path of transistor $T_2$ is of the opposite direction. Thus, by means of the additional diode $D_5$ in series with the resistor $R_2$, the voltage set up at the base of transistor $T_5$ is equal to $2V_o+$ the (temperature-independent) voltage drop across resistor $R_2$. Since the diodes have a low temperature-independent series-resistance this temperature-dependent voltage $2V_0$ does not exactly compensate for the voltage drop across the two base-emitter paths of the transistors $T_5$ and $T_6$, but it is possible to make up for this by designing the resistors $R_1$ and/or $R_3$ to have low positive temperature coefficients. This effect may already be obtained in a satisfactory manner if the resistors are integrated as channels on the same semiconductor element as are the remaining circuit elements shown (except the variable resistor $R_2$).

In case of battery supply, the additional current flowing through the diodes $D_1$ and $D_2$ is undesirable. However, in practice, the said current may be kept very small. When transistor $T_4$ is controlled into its saturation range its collector voltage in theory becomes zero. As a result the voltage across resistor $R_1$ increases, resulting in an increase of the current flow through the diodes $D_1$ and $D_2$. When the control of transistor $T_4$ is at a maximum, approximately its maximum base current flows through the diodes $D_1$ and $D_2$. The difference between the no-load current and the current which flows with maximum control may be increased by connecting one or more diodes $D_3$ and $D_4$ in series with resistor $R_1$. The presence of the diodes $D_3$ and $D_4$ has also the effect that the diodes $D_1$ and $D_2$ (and hence $D_3$ and $D_4$) remain in the cut-off condition for a longer period when the transistor $T_6$ is controlled, and hence do not extract current from the direct voltage source E for a longer period.

What is claimed is:

1. In a push-pull amplifying circuit of the type including first and second output transistors, in which the supply current flows in series through the emitter-collector paths of these transistors and in which a point of their common connecting circuit is connected to the load, said first output transistor being preceded by a driver transistor, wherein the improvement comprises diode means polarized in the pass direction and connected between the collector of said driver transistor and said common connecting circuit, the emitter of said driver transistor being connected to the base of the said first output transistor, the pass direction of the said diode means corresponding to an increase in the collector supply voltage of said driver transistor relative to that of the said first output transistor.

2. A push-pull amplifying circuit as claimed in claim 1, characterized in that said diode means is also adjusted for compensation of the temperature-dependent inner emitter-base threshold voltage of said second output transistor.

3. A push-pull amplifying circuit as claimed in claim 1, characterized in that the common point of the collector of the said control transistor and the said diodes means is connected to a point of constant potential via the series-combination of a resistor and second diode means.

4. A push-pull amplifying circuit as claimed in claim 3, characterized in that said resistor has a low positive temperature coefficient.

5. A push-pull amplifier circuit comprising first and second output transistors, a source of operating potential having first and second terminals, means connecting the emitter of said first output transistor to said first terminal, means connecting the collector-emitter path of said second output transistor between said second terminal and the collector of said first transistor, a load circuit connected between the collector of said first transistor and one of said terminals, a first driver transistor of the same conductivity type of said first output transistor, means connecting the emitter of said driver transistor to the base of said first output transistor, means connecting the collector of said driver transistor to said second terminal, a source of signals, means applying said signals to the bases of said driver transistor and second output transistor, and diode means connected between the collectors of said driver and first output transistors, said diode means having a polarity to pass current in a direction whereby the collector voltage of said driver transistor is higher than the collector voltage of said first output transistor.

6. The amplifier circuit of claim 5 wherein said means connecting the collector of said transistor to said second terminal includes series diode means having a polarity to conduct current in the same direction between the collector of said first driver transistor and second terminal as said first mentioned diode means.

7. The amplifier circuit of claim 5 in which said load circuit comprises the series circuit of a capacitor and a load device connected in that order between the collector of said first output transistor and said second terminal, wherein said means applying said signals comprises an input transistor, and a second driver transistor, said second driver transistor being of the opposite conductivity type of said first transistor and having its base connected to the collector of said input transistor and its emitter and collector electrodes connected to the collector and base electrodes of said first driver transistor.

8. The amplifier circuit of claim 7 comprising wherein said means applying said signals further comprises resistance means connected in series between the collector of said input transistor and the junction of said capacitor and load device, and a third driver transistor having its input electrode connected to a tap on said resistance means and its output electrode connected to the base of said second output transistor.

9. The amplifier circuit of claim 8 comprising diode means connected in series between the collector of said input transistor and said resistance means.

References Cited

UNITED STATES PATENTS

| | | | |
|---|---|---|---|
| 3,215,946 | 11/1965 | Likel | 330—40 X |
| 3,237,117 | 2/1966 | Collings et al. | 330—17 X |

ROY LAKE, *Primary Examiner.*

LAWRENCE J. DAHL, *Assistant Examiner.*

U.S. Cl. X.R.

330—24